(12) United States Patent
Tan et al.

(10) Patent No.: US 10,763,840 B1
(45) Date of Patent: Sep. 1, 2020

(54) COMPARATOR CIRCUIT WITH HYSTERESIS FUNCTION AND A SEMICONDUCTOR DEVICE THEREOF

(71) Applicant: Lite-On Singapore Pte. Ltd., Singapore (SG)

(72) Inventors: Meng-Tong Tan, Singapore (SG); You-Fa Wang, Singapore (SG)

(73) Assignee: LITE-ON SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/660,883

(22) Filed: Oct. 23, 2019

(51) Int. Cl.
  *H03K 3/00* (2006.01)
  *H03K 5/24* (2006.01)
  *H03K 3/3565* (2006.01)

(52) U.S. Cl.
  CPC ......... *H03K 5/2481* (2013.01); *H03K 3/3565* (2013.01)

(58) Field of Classification Search
  CPC combination set(s) only.
  See application file for complete search history.

(56) References Cited

U.S. PATENT DOCUMENTS

| | | | | |
|---|---|---|---|---|
| 7,187,223 B2* | 3/2007 | Yeo | ..................... | H03K 3/02337 327/205 |
| 7,292,083 B1* | 11/2007 | Wang | ................... | H03K 5/2472 327/205 |
| 10,305,462 B1* | 5/2019 | Wang | ................... | H03K 5/2481 |

* cited by examiner

*Primary Examiner* — Long Nguyen
(74) *Attorney, Agent, or Firm* — Li & Cai Intellectual Property (USA) Office

(57) ABSTRACT

A comparator circuit includes a first comparator, a second comparator and an inverter. The first comparator includes two N-channel metal-oxide-semiconductor (NMOS) transistors, two first P-channel metal-oxide-semiconductor (PMOS) transistors and two second PMOS transistors. A gate of the NMOS transistors respectively receives first and second voltages, and sources of the first PMOS transistors are connected to first and second resistors, respectively. The first comparator outputs differential output signals from drains of the NMOS transistors according to the voltage difference between the first and second voltages. An output of the second comparator is connected to gates of the first PMOS transistors of the first comparator. An input of the inverter is connected to the output of the second comparator, and an output of the inverter is connected to gates of the PMOS transistors.

18 Claims, 3 Drawing Sheets

COMPARATOR CIRCUIT WITH HYSTERESIS FUNCTION AND A SEMICONDUCTOR DEVICE THEREOF

FIELD OF THE DISCLOSURE

The present disclosure relates to a comparator circuit with hysteresis function and a semiconductor device thereof, and more particularly to a comparator circuit with hysteresis function that avoids hysteresis window drift.

BACKGROUND OF THE DISCLOSURE

Generally, a comparator is applied to a voltage difference input between a positive phase input and a negative phase input. When a voltage of the positive phase input is higher than the voltage of the negative phase input, a high voltage level signal is output at an output. When the voltage of the positive phase input is lower than the voltage of the negative phase input, a low voltage level signal is output at the output.

The sensitivity of the comparator is high, and the anti-interference of the comparator is poor. If an input voltage or a ground terminal contains some noise, output error will be generated. Therefore, a hysteresis function is usually added to a comparator circuit, and signal hysteresis can be used to avoid oscillation of the comparator output caused by the input noise.

FIG. 1 is a circuit diagram of a conventional hysteresis comparator. As shown in FIG. 1, in a comparator circuit 10 with hysteresis function, two N-channel metal-oxide-semiconductor (NMOS) transistors 11 and 12 form a differential pair, and connect to a first input voltage (VP) and a second input voltage (VM), respectively. When noise exists, the voltage value of the first input voltage (VP) and the second input voltage (VM) will be slightly different. The difference results in errors in the output of the comparator without hysteresis. Therefore, two P-channel metal-oxide-semiconductor (PMOS) transistors 14 and 15 are added to the comparator circuit 10 with hysteresis function, which avoids the output change of the comparator 10 due to noise in the input signal. The threshold value is set by the two PMOS transistors 14 and 15, so that the output signal of the comparator 10 with hysteresis function outputs a high level or low level signal when the output of the comparator 10 with hysteresis function is higher than the upper threshold or lower than the lower threshold, the high level or low level signal will be output. The output signal of the comparator with hysteresis function does not change between the upper and lower thresholds, and is called the hysteresis window. However, the upper and lower thresholds of the threshold values of the two PMOS transistors 14 and 15 are easily changed by the semiconductor manufacturing process or temperature, and variations in the threshold value result in a change in the hysteresis window.

Therefore, reducing the change of the hysteresis window in the comparator with hysteresis function with the influence of semiconductor production process or temperature through the improvement of circuit design has become one of the important issues to be solved.

SUMMARY OF THE DISCLOSURE

In response to the above-referenced technical inadequacies, the present disclosure provides a comparator circuit with hysteresis function and a semiconductor device incorporating the same, which comparator circuit having a first comparator, a second comparator and an inverter. The first comparator includes two NMOS transistors, two first and two second PMOS transistors. Gates of the two NMOS transistors are connected to a first voltage and a second voltage, respectively, sources of the two NMOS transistors are connected to a current source, drains of the two NMOS transistors are connected to drains of the two first PMOS transistors, sources of the two first PMOS transistors are connected to a first resistor and a second resistor, respectively. The first comparator outputs two differential output signals from the drains of the two NMOS transistor according to a voltage difference between the first voltage and the second voltage. And a semiconductor device is incorporating such that hysteresis comparator circuit.

Therefore, one of the beneficial effects of the present disclosure is that, the compensator with hysteresis function provided by the present disclosure has the technical features of compensating the threshold voltage of the PMOS transistor through the feedback circuit and configuration of a resistor, so as to reduce the temperature sensitivity of a hysteresis window.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
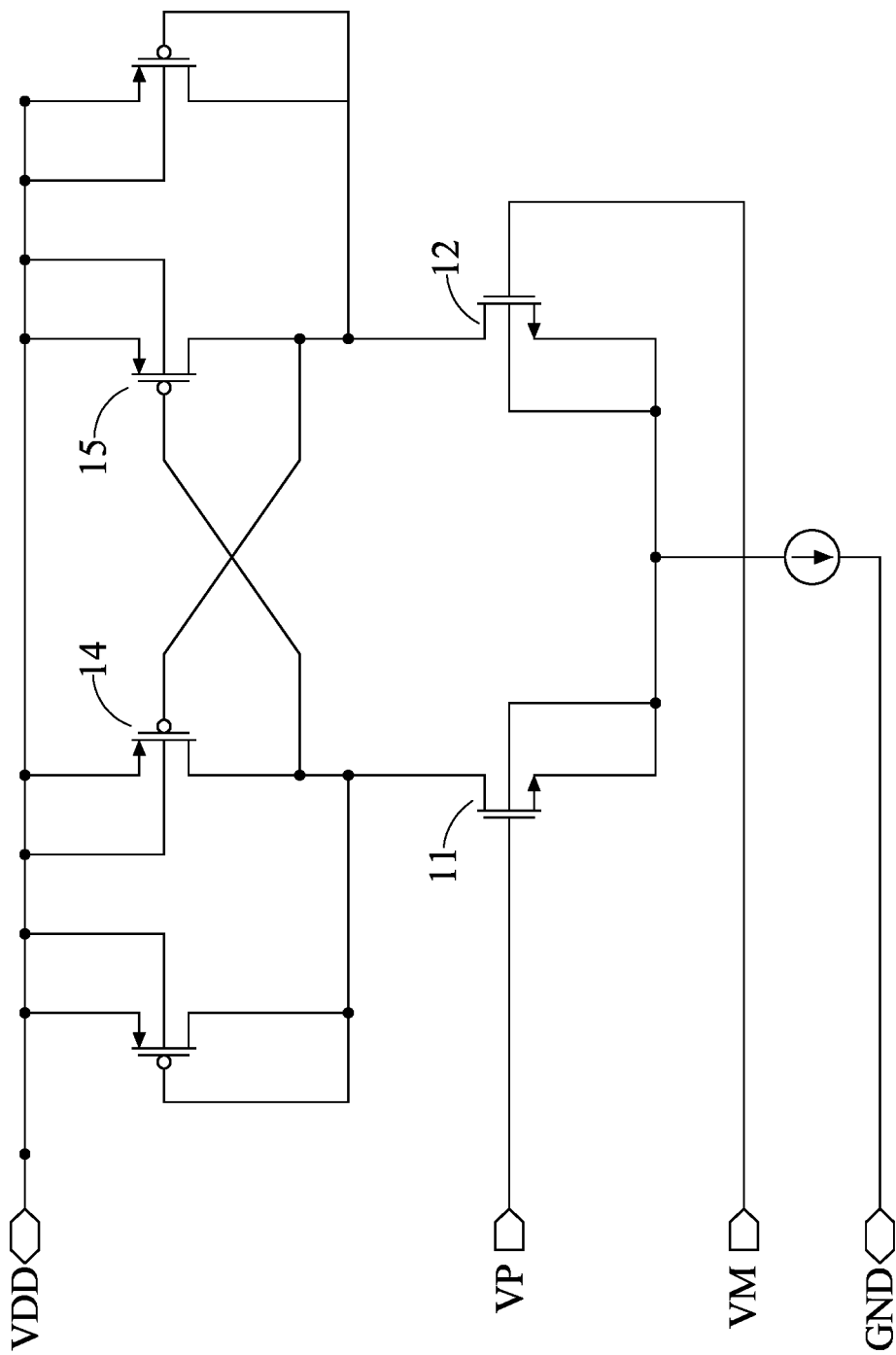
FIG. 1 is a circuit diagram of a conventional hysteresis comparator.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

Figure 2:
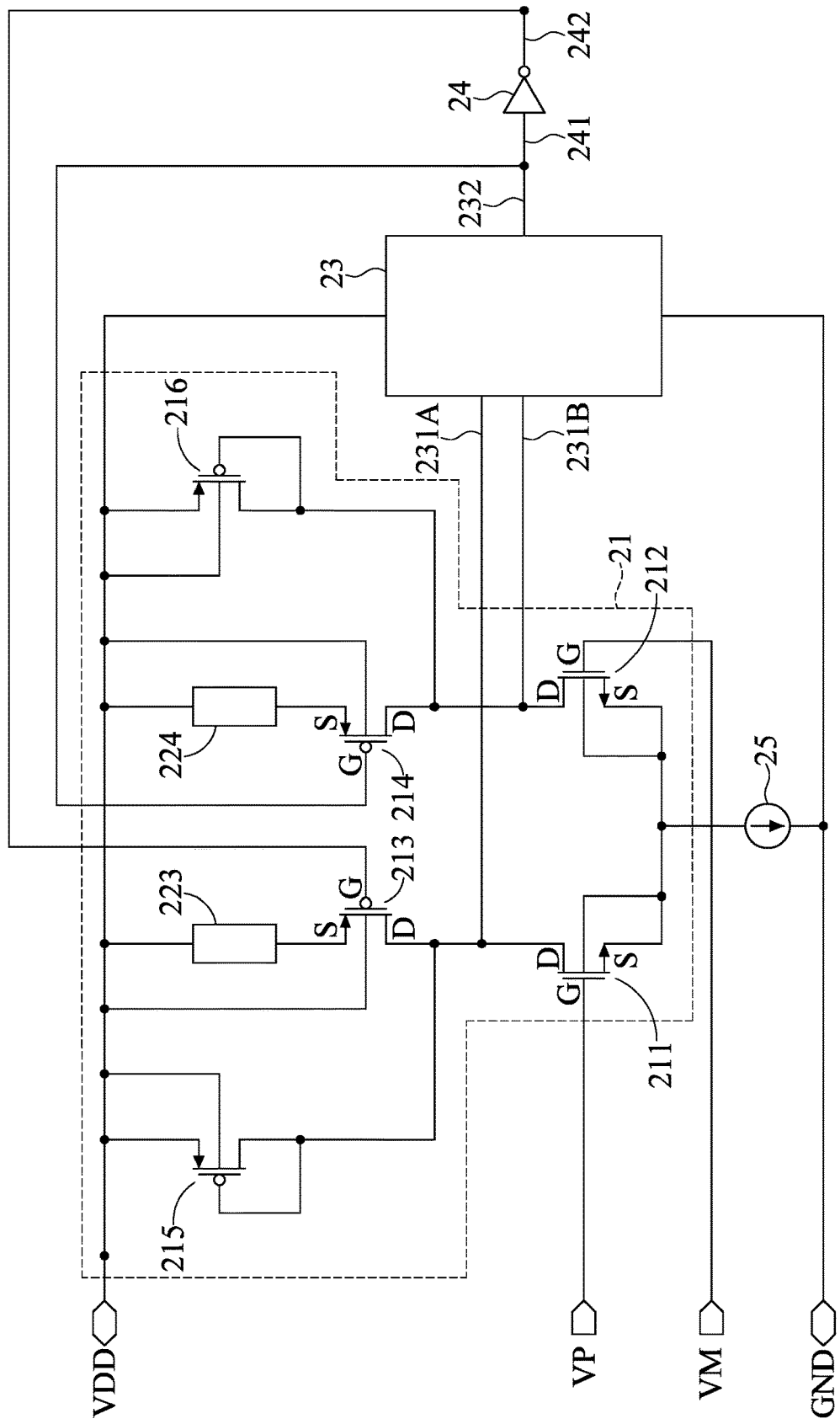
FIG. 2 is a schematic view of a hysteresis comparator circuit of an exemplary embodiment of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

FIG. 2 is a schematic view of a hysteresis comparator circuit of an exemplary embodiment of the present disclosure. As shown in FIG. 2, an exemplary embodiment of the present disclosure provides a comparator circuit 20 with a hysteresis function, including a first comparator 21, a second comparator 23 and an inverter 24.

The first comparator 21 includes two NMOS transistors 211 and 212, two first PMOS transistors 213 and 214 and two second PMOS transistors 215 and 216. In different embodiments, the first comparator 21 may also be composed of different transistors, and is not limited herein. The two NMOS transistors 211 and 212 form a differential pair, and the hysteresis function is provided by two first PMOS transistors 213 and 214, in other words, a complementary pair is formed by two first PMOS transistors 213 and 214 to provide a hysteresis window. A current source 25 is connected to a source (S) of the NMOS transistors 211 and 212, the common voltage source (VDD) is connected to the sources (S) of the first PMOS transistors 213 and 214 and the sources (S) of the second PMOS transistors 215 and 216 of the first comparator 21 and the second comparator 23. The second PMOS transistors 215 and 216 are used to provide resistance values for the first comparator 21.

A first voltage (VP) and a second voltage (VM) are connected to the gates (G) of the NMOS transistor 211 and 212 of the first comparator 21, respectively. The first comparator 21 outputs two differential output voltages to the drain (D) of the NMOS transistors 211 and 212 according to a voltage difference between the first voltage (VP) and the second voltage (VM) of the gate (G) of the NMOS transistors 211 and 212. Further, when the voltage difference between the first voltage (VP) and the second voltage (VM) is a positive phase difference, the two differential output voltages of the high level are output. When the voltage difference between the first voltage (VP) and the second voltage (VM) is a negative phase difference, the two differential output voltages of the low level are output. In addition, the working method of the first comparator 21 is well known to those skilled in the art and will not be described herein. The gate (G) of the NMOS transistors 213 and 214 of the first comparator 21 is the input of the first comparator 21, that is, the first voltage (VP) and the second voltage (VM) are transmitted to the input of the first comparator 21, respectively. In addition, the drains (D) of the NMOS transistors 213 and 214 of the first comparator 21 are the outputs of the first comparator 21.

Further, the first PMOS transistors 213 and 214 of the first comparator 12 are used to provide a hysteresis window to the first comparator 21. The drains (D) of the first PMOS transistors 213 and 214 are connected to the drains (D) of the NMOS transistors 211 and 212. In addition, the source (S) of the first PMOS transistors 213 and 214 are connected to the first resistor 223 and the second resistor 224, respectively. The resistance values of the first resistor 223 and the second resistor 224 are preferably between 5K ohms and 200K ohms. The first resistor 223 and the second resistor 224 are used to adjust the threshold voltages of the PMOS transistors 213 and 214, thereby improving on an issue of the hysteresis window of the comparator circuit 20 being susceptible to an influence of temperature. The first resistor 223 is a resistor closer to the common voltage source (VDD), the second resistor 224 is a resistor farther from the common voltage source (VDD), and the resistance values of the first resistor 223 and the second resistor 224 are the same. The drains (D) of the PMOS transistors 213 and 214 connect to the drains (D) of the NMOS transistors 211 and 212, and sources (S) of the two first PMOS transistors 213 and 214 connect to common voltage source (VDD).

The second comparator 23 includes a first input 231A, a second input 231B and an output 232. In addition, the first input 231A and the second input 231B of the second comparator 23 are connected to the drains (D) of the NMOS transistors 211 and 212 of first comparator 21 and the drains (D) of the PMOS transistors 213 and 214. The output 232 of the second comparator 23 is connected to the input 241 of the inverter 24 and the gates (G) of the two first PMOS transistors 213 and 214 of the first comparator 21. The purpose of installing the second comparator 23 is to stabilize the voltage of the comparator circuit 20. When the differential output voltage output by the first comparator 21 has a positive phase difference, the second comparator 23 outputs a forward signal. When the differential output voltage output by the first comparator 21 has a negative phase difference, the second comparator outputs a reverse signal.

In addition, the inverter 24 includes an input 241 and an output 242. The input 241 of the inverter 24 is connected to the gate (G) of one of the first PMOS transistors 214 of the first comparator 21 and the output 232 of the second comparator 23. The output 241 of the inverter 24 is connected to the gate (G) of another first PMOS transistor 213. Therefore, a forward and reverse signal can be provided at the gates (G) of the first PMOS transistors 214 and 213, respectively, to control turn-on and turn-off of the PMOS transistors 213 and 214 of the first comparator 21. Further, when the second comparator 23 outputs a forward signal, the forward signal drives the PMOS transistor 214, which is connected to the second resistor 224. Conversely, when the second comparator 23 outputs the reverse signal, the reverse signal is transmitted to the inverter 24, and is converted to the forward signal by the inverter 24 to drive the gate (G) of the PMOS transistor 213, which is connected to the first resistor 223. In other words, through inverter 24, when the PMOS transistor 214 of the first comparator 21 is turned on, the PMOS transistor 213 is turned off, and when the PMOS transistor 214 of the first comparator 21 is turned off, the PMOS transistor 213 is turned on.

Figure 3:
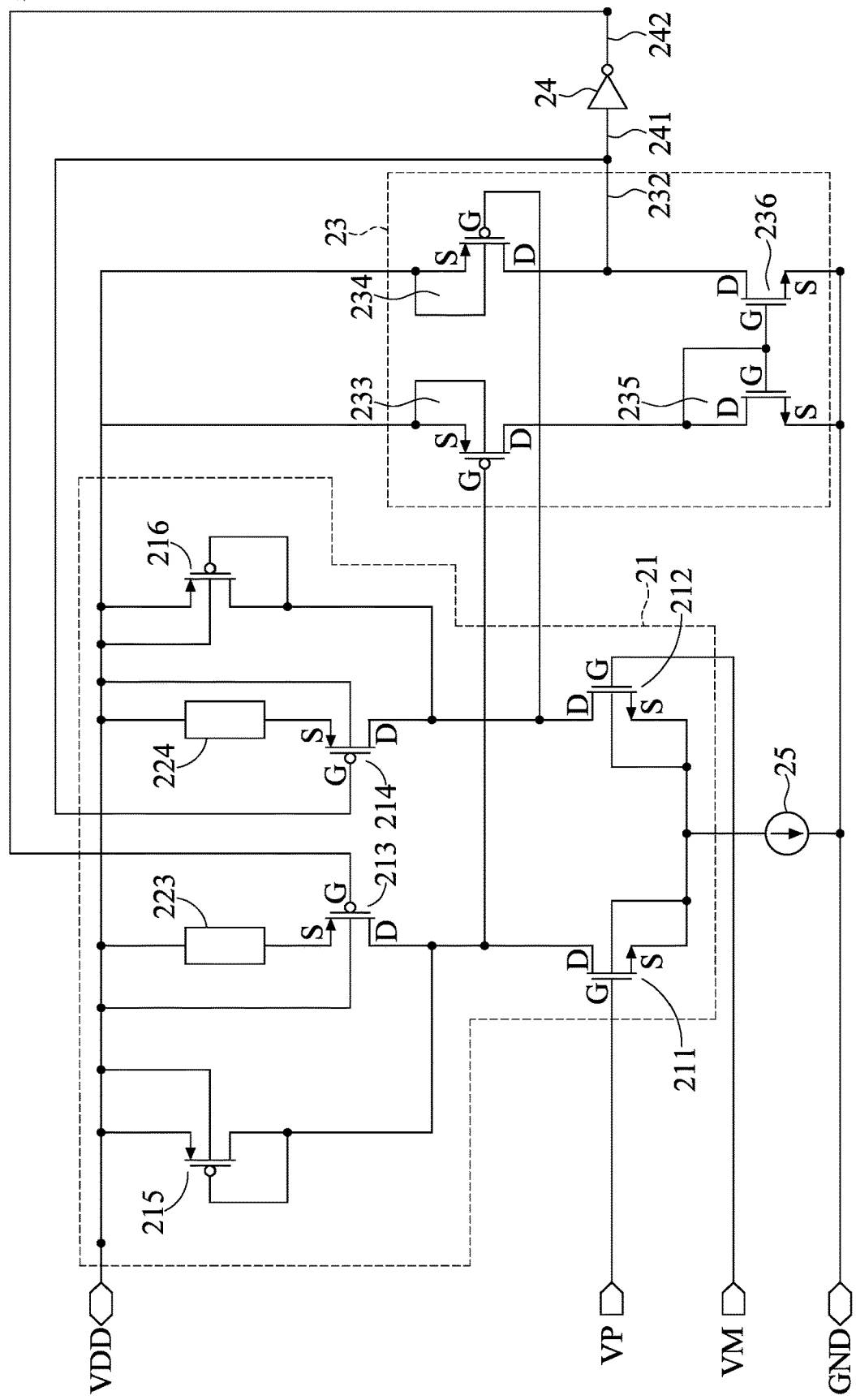
FIG. 3 is a schematic view of a hysteresis comparator circuit of an embodiment of the present disclosure.

In addition, in the exemplary embodiment of the present disclosure, the second comparator 23 preferably includes two PMOS transistors 233, 234 and two NMOS transistors 235, 236. As shown in FIG. 3, the gates (G) of the PMOS transistors 233, 234 of the second comparator 23 are the inputs 231A and 231B of the second comparator 23, and connect to the drains (D) of the NMOS transistors 211, 212 of the first comparator 21 and the drains (D) of the first PMOS transistors 213 and 214, respectively. The drain (D) of the PMOS transistor 234 of the second comparator 23 and the drain (D) of the NMOS transistor 236 are the output 232 of the second comparator 23, and the drain (D) of the PMOS transistor 234 and the drain (D) of the NMOS transistor 236 are connected to the input 241 of the inverter 24. However, the above description only describes the component composition of the second comparator 23, and the second comparator 23 is not limited to the present disclosure. In different embodiments, the second comparator 23 may also be composed of different circuits, which is not limited herein. The second comparator 23 in this embodiment may also be referred to as a differential to single end comparator. When the two differential output voltages of the first comparator 21 are transmitted to the gates (G) of the PMOS transistors 233 and 234 of the second comparator 23 via the drains (D) of the NMOS transistors 211 and 212, respectively, according to the difference between the two differential output voltages (as called differential output signals), if the difference is a positive phase difference, the second comparator 23 outputs the forward signal; and if the difference is a negative phase difference, the second comparator 23 outputs a reverse signal. The forward signal or the reverse signal output through the drain (D) of the PMOS transistor 233 or 234 of the second comparator 23 is transmitted to the inverter 24.

When there is a difference between the signals of the NMOS transistors 211 and 212 of the first comparator 21, that is, between the signals transmitted to the PMOS transistors 223 and 224 or transmitted to the first input 231A and the second input 231B of the second comparator 23, if the difference is a positive phase difference, the forward signal will be output to the PMOS transistor 214 or via the inverter 24 to the PMOS transistor 213; if the difference is a negative phase difference, a reverse signal will be output to the PMOS transistor 214 or via the inverter 24 to the PMOS transistor 213. In other words, if the second comparator 23 outputs the forward signal, the PMOS transistor 214 will be driven; if the second comparator 23 outputs the reverse signal, the PMOS transistor 213 will be driven. The forward and reverse output signals of the second comparator 23 are output to the PMOS transistors 213 and 214 through the inverter 24, and the first resistor 223 and the second resistor 224, so as to improve the disadvantage that the hysteresis window is susceptible to the influence of temperature.

In addition, the resistance value of the first resistor 223 is the same as the resistance value of the second resistor 224.

Further, the comparator circuit 20 of the present embodiments may be extensively applied to a semiconductor device, including, for example, a power management IC or a circuit for indicating whether a sufficient supply voltage is available or not. And the semiconductor device incorporates such that the comparator circuit 20 with hysteresis functions as shown in FIGS. 2 and 3, and the resistance values of the first resistor and the second resistor are preferably between 5K ohms and 200K ohms.

One of the beneficial effects of the present disclosure is that, the compensator with hysteresis function provided by the present disclosure has the technical features of compensating the threshold voltage of the PMOS transistor through the feedback circuit and configuration of a resistor, so as to reduce the temperature sensitivity of a hysteresis window.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A comparator circuit with hysteresis function comprising:
    a first comparator including two NMOS transistors, two first PMOS transistors and two second PMOS transistors; wherein gates of the two NMOS transistors are connected to a first voltage and a second voltage, respectively, sources of the two NMOS transistors are connected to a current source, drains of the two NMOS transistors are connected to drains of the two first PMOS transistors, sources of the two first PMOS transistors are connected to a first resistor and a second resistor, respectively, and the first comparator outputs two differential output signals from the drains of the two NMOS transistors according to a voltage difference between the first voltage and the second voltage, wherein sources of the two second PMOS transistors are electrically connected to a common voltage source;
    a second comparator including a first input, a second input and an output, wherein the first input and the second input are connected to the drains of the two NMOS transistors of the first comparator and the drains of the two first PMOS transistors, respectively, the output of the second comparator is connected to the gates of the two first PMOS transistors of the first comparator; and
    an inverter including an input and an output, wherein the input of the inverter is connected to the output of the second comparator and the gate of one of the two first PMOS transistors of the first comparator, and the output of the inverter is connected to the gate of the other of the two first PMOS transistors of the first comparator;
    wherein threshold voltages of the two first PMOS transistors of the first comparator are adjusted by the first resistor and the second resistor.

2. The comparator circuit according to claim 1, wherein the two second PMOS transistors of the first comparator are used to provide resistance values.

3. The comparator circuit according to claim 2, wherein the resistance value of the first resistor is same as the resistance value of the second resistor.

4. The comparator circuit according to claim 1, wherein the resistance values of the first resistor and the second resistor are between 5K ohms and 200K ohms.

5. The comparator circuit according to claim 1, wherein the common voltage source is connected to the sources of the two first PMOS transistors of the first comparator via the first resistor and the second resistor and the second comparator.

6. The comparator circuit according to claim 1, wherein the second comparator compares the two differential output signals of the first comparator received by the first input and the second input; if the two differential output signals have a positive phase difference, the output of the second comparator outputs a forward signal to the gate of one of the two first PMOS transistors connecting to the second resistor; if the two differential output signals has a negative phase difference, the output of the second comparator outputs a reverse signal to the input of the inverter, and the output of the inverter outputs the forward signal to the gate of one of the two first PMOS transistors connecting to the first resistor.

7. The comparator circuit according to claim 6, wherein the forward signal or the reverse signal of the gates of the two first PMOS transistors transmitted to the first comparator by the second comparator drives turn on or turn off of the two first PMOS transistors of the first comparator.

8. The comparator circuit according to claim 7, wherein when the second comparator outputs the reverse signal, the reverse signal is converted into the forward signal by the inverter, so that the forward signal is transmitted from the output of the inverter to the gate of one of the two first PMOS transistors of the first comparator connected to the first resistor.

9. The comparator circuit according to claim 1, wherein the second comparator includes two PMOS transistors and two other NMOS transistors, the drains of the two NMOS transistors of the first comparator connect to the gates of the two PMOS transistors of the second comparator, and the drain of one of the two PMOS transistors of the second comparator and the drain of one of the two other NMOS transistors connect to the input of the inverter and the gate of one of the two first PMOS transistors of the first comparator.

10. The comparator circuit according to claim 9, wherein the two differential output signals of the first comparator are transmitted to the gates of the two PMOS transistors of the second comparator via the drains of the two NMOS transistors of the first comparator, respectively, and then transmitted to the inverter via the forward signal or the reverse signal outputted by the drains of the two PMOS transistors of the second comparator or the drains of the two other NMOS transistors.

11. A semiconductor device that incorporates the comparator circuit with hysteresis function as claimed in claim 1, wherein the resistance values of the first resistor and the second resistance are between 5K ohms and 200K ohms.

12. The semiconductor device according to claim 11, wherein the resistance value of the first resistor is same as the resistance value of the second resistor.

13. The semiconductor device according to claim 11, wherein the common voltage source is connected to the sources of the two first and second PMOS transistors of the first comparator and the second comparator.

14. The semiconductor device according to claim 11, wherein the second comparator compares the two differential output signals of the first comparator received by the first input and the second input; if the two differential output signals have a positive phase difference, the output of the second comparator outputs a forward signal to the gate of one of the two first PMOS transistors connecting to the second resistor; if the two differential output signals has a negative phase difference, the output of the second comparator outputs a reverse signal to the input of the inverter, and the output of the inverter outputs the forward signal to the gate of one of the two first PMOS transistors connecting to the first resistor.

15. The semiconductor device according to claim 14, wherein the forward signal or the reverse signal of the gates of the two first PMOS transistors transmitted to the first comparator by the second comparator drive turn on or turn off of the two first PMOS transistors of the first comparator.

16. The semiconductor device according to claim 15, wherein when the second comparator outputs the reverse signal, the reverse signal is converted into the forward signal by the inverter, so that the forward signal is transmitted from the output of the inverter to the gate of one of the two first PMOS transistors of the first comparator connected to the first resistor.

17. The semiconductor device according to claim 11 wherein the second comparator includes two PMOS transistors and two other NMOS transistors, the drains of the two NMOS transistors of the first comparator connect to the gates of the two PMOS transistors of the second comparator, and the drain of one of the two PMOS transistors of the second comparator and the drain of one of the two other NMOS transistors connect to the input of the inverter and the gate of one of the two first PMOS transistors of the first comparator.

18. The semiconductor device according to claim 17, wherein the two differential output signals of the first comparator are transmitted to the gates of the two PMOS transistors of the second comparator via the drains of the two NMOS transistors of the first comparator, respectively, and then transmitted to the inverter via the forward signal or the reverse signal outputted by the drains of the two PMOS transistors of the second comparator or the drains of the two other NMOS transistors.

\* \* \* \* \*